United States Patent
Cha et al.

(10) Patent No.: US 10,983,439 B2
(45) Date of Patent: *Apr. 20, 2021

(54) CALCITE CHANNEL NANOFLUIDICS

(71) Applicant: Saudi Arabian Oil Company, Dhahran (SA)

(72) Inventors: Dong Kyu Cha, Abqaiq (SA); Mohammed Al Otaibi, Abqaiq (SA); Ali Abdallah Al-Yousef, Dhahran (SA)

(73) Assignee: Saudi Arabian Oil Company, Dhahran (SA)

( * ) Notice: Subject to any disclaimer, the term of this patent is extended or adjusted under 35 U.S.C. 154(b) by 0 days.

This patent is subject to a terminal disclaimer.

(21) Appl. No.: 16/394,817

(22) Filed: Apr. 25, 2019

(65) Prior Publication Data
US 2019/0250514 A1 Aug. 15, 2019

Related U.S. Application Data

(63) Continuation of application No. 15/673,147, filed on Aug. 9, 2017, now Pat. No. 10,365,564.

(51) Int. Cl.
*G03F 7/20* (2006.01)
*H01L 23/34* (2006.01)
(Continued)

(52) U.S. Cl.
CPC ........... *G03F 7/2059* (2013.01); *G03F 7/038* (2013.01); *G03F 7/0757* (2013.01); *G03F 7/325* (2013.01); *G03F 7/40* (2013.01); *H01L 23/34* (2013.01)

(58) Field of Classification Search
CPC ...... G03F 7/2059; G03F 7/038; G03F 7/0757; G03F 7/325; G03F 7/40; H01L 23/34
See application file for complete search history.

(56) References Cited

U.S. PATENT DOCUMENTS 4,564,997 A * 1/1986 Matsuo ............... H01L 21/0272
148/DIG. 131
2004/0146803 A1 7/2004 Kohl et al.
(Continued)

FOREIGN PATENT DOCUMENTS

| WO | 2009149362 | 12/2009 |
|---|---|---|
| WO | 2017009710 | 1/2017 |
| WO | 2019032903 | 2/2019 |

OTHER PUBLICATIONS

International Search Report and Written Opinion issued in International Application No. PCT/US2018/046118 dated Nov. 9, 2018, 15 pages.
(Continued)

*Primary Examiner* — Su C Kim
(74) *Attorney, Agent, or Firm* — Fish & Richardson P.C.

(57) ABSTRACT

A method for fabricating calcite channels in a nanofluidic device is described. A photoresist is coated on a substrate, and a portion of the photoresist is then exposed to a beam of electrons in a channel pattern. The exposed portion of the photoresist is developed to form a channel pattern, and calcite is deposited in the channel pattern using a calcite precursor gas. The deposited calcite includes at least one side having a length in a range of approximately 50 to 100 nanometers. The photoresist remaining after developing the exposed portion of the photoresist is removed.

14 Claims, 4 Drawing Sheets

(51) Int. Cl.
G03F 7/038 (2006.01)
G03F 7/075 (2006.01)
G03F 7/32 (2006.01)
G03F 7/40 (2006.01)

(56) References Cited

U.S. PATENT DOCUMENTS

| | | | |
|---|---|---|---|
| 2008/0246052 A1* | 10/2008 | Hsu | H01L 23/3735 257/99 |
| 2009/0104564 A1 | 4/2009 | Yang | |
| 2010/0330721 A1 | 12/2010 | Barlocchi et al. | |
| 2011/0123771 A1 | 5/2011 | Stavis et al. | |
| 2012/0267603 A1* | 10/2012 | Lee | B82Y 10/00 257/9 |
| 2013/0236698 A1 | 9/2013 | Stavis et al. | |
| 2013/0316329 A1 | 11/2013 | Yu | |
| 2016/0363600 A1 | 12/2016 | Sniadecki et al. | |
| 2017/0067836 A1 | 3/2017 | Hull | |
| 2017/0114242 A1 | 4/2017 | Lloyd et al. | |

OTHER PUBLICATIONS

Becker et al., "Polymer microfluidic devices," Talanta, vol. 56, No. 2, Feb. 11, 2002, 21 pages.

Lee et al., "Site-Selective in Situ Grown Calcium Carbonate Micromodels with Tunable Geometry, Porosity and Wettability," Advanced Functional Materials, vol. 26, Jul. 1, 2016, 10 pages.

Lifton, "Microfluidics: an enabling screening technology for enhanced oil recovery (EOR)," Lab on a Chip, Royal Society of Chemistry, vol. 16, vol. 10, May 21, 2016, 20 pages.

Ren et al., "Materials for Microfluidic Chip Fabrication," Accounts of Chemical Research, vol. 46, issue 11, Jun. 11, 2013, 11 pages.

Sander et al., "Template-Assisted Fabrication of Dense, Aligned Arrays of Titania Nanotubes with Well-Controlled Dimensions of Substrates," Advanced Materials, vol. 16, No. 22, Nov. 18, 2004, 6 pages.

Song et al., "Chip-off-the-old-rock: the study of reservoir-relevant geological processes with real-rock micromodels," Lab on a Chip, Royal Society of Chemistry, vol. 14, Sep. 11, 2014, 9 pages.

Spende et al., "TiO2, SiO2, and Al2O3 coated nanopores and nanotubes produced by ALD in etched ion-track membranes for transport measurements," Nanotechnology, vol. 26, Aug. 2015, 12 pages.

Zheng et al., "Surface Effect on Oil Transportation in Nanochannel: a Molecular Dynamics Study," Nanoscale Research letters, vol. 12, No. 1, Jun. 15, 2017, 9 pages.

International Search Report and Written Opinion issued in International Application No. PCT/US2019/048322 dated Jan. 7, 2020, 13 pages.

GCC Examination Report in GCC Appln. No. GC 2018-35814, dated Jan. 30, 2020, 3 pages.

International Search Report and Written Opinion issued in International Application No. PCT/US2019/063996 dated Mar. 23, 2020, 14 pages.

Lu et al., "Fabrication of Nanostructure by Template Method in Microfluidics," Chinese Journal of Analytical Chemistry, vol. 37, No. 6, Jun. 1, 2009, 6 pages.

* cited by examiner

CALCITE CHANNEL NANOFLUIDICS

CROSS REFERENCE TO RELATED APPLICATIONS

This application is a continuation of and claims the benefit of priority to U.S. patent application Ser. No. 15/673,147, filed Aug. 9, 2017, the contents of which are incorporated by reference herein.

TECHNICAL FIELD

This specification relates to nanofluidics and more specifically for petrophysical application.

BACKGROUND

Enhanced oil recovery methods are utilized to increase the amount of crude oil that can be extracted from an oil field. At small scales (channel sizes on the order or nanometers or micrometers), fluids can behave differently in that factors such as surface tension begin to dominate the system. With better understanding of fluid behavior at small scales, enhanced oil recovery methods can be improved to extract even more oil from a source rock or reservoir. Microfluidic models which can replicate conditions found in underground reservoirs have been developed to observe, evaluate, and understand physical and chemical phenomena in oil extraction and recovery.

SUMMARY

The present disclosure describes a method of fabricating calcite channels for nanofluidics. Certain aspects of the subject matter described here can be implemented as a method. Calcite channels are fabricated in a nanofluidic device. A photoresist is coated on a substrate, and a portion of the photoresist is exposed to a beam of electrons in a channel pattern. The exposed portion of the photoresist is developed to form a channel pattern, and calcite is deposited in the channel pattern using a calcite precursor gas. The deposited calcite includes at least one side having a length in a range of approximately 50 to 100 nanometers (nm). The photoresist remaining after developing the exposed portion of the photoresist is removed.

This, and other aspects, can include one or more of the following features. The substrate can be silicon. The photoresist can be a negative photoresist, such as polydimethylsiloxane (PDMS) or SU-8. Developing the photoresist can include dissolving the photoresist using a solvent and revealing a portion of the substrate. The solvent used to dissolve the photoresist can be propylene glycol methyl ether acetate (PGMEA), ethyl lactate, or di-acetone alcohol. Fabricating calcite channels in the nanofluidic device can include packaging the device in a casing. The casing can include a top portion which includes a window, a bottom portion to hold the device, an inlet connection to allow a fluid to enter the device, and an outlet connection to allow the fluid to exit the device. The window can be an electrically conductive and optically transparent material, such as silicon nitride (SiN).

Certain aspects of the subject matter described here can be implemented as a system. The system includes a nanofluidic device, a casing for the device, and an electron source for providing a beam of electrons. The device includes a bottom portion which includes a substrate, and a top portion which includes a calcite channel structure. The calcite channel structure includes at least one side having a length in a range of approximately 50 to 100 nm. This, and other aspects, can include one or more of the following features. The substrate can be silicon. The electron source can be a scanning electron microscope (SEM). The casing can include a top portion which includes a window, a bottom portion to hold the device, an inlet connection to allow a fluid to enter the device, and an outlet connection to allow the fluid to exit the device. The window can be an electrically conductive and optically transparent material, such as SiN.

The details of one or more implementations of the subject matter of this specification are set forth in the accompanying drawings and the description. Other features, aspects, and advantages of the subject matter will become apparent from the description, the drawings, and the claims.

DESCRIPTION OF DRAWINGS

Like reference numbers and designations in the various drawings indicate like elements.

DETAILED DESCRIPTION

The following detailed description describes a method of fabricating calcite channels for nanofluidics, and is presented to enable any person skilled in the art to make and use the disclosed subject matter in the context of one or more particular implementations. Various modifications, alterations, and permutations of the disclosed implementations can be made and will be readily apparent to those or ordinary skill in the art, and the general principles defined may be applied to other implementations and applications, without departing from scope of the disclosure. In some instances, details unnecessary to obtain an understanding of the described subject matter may be omitted so as to not obscure one or more described implementations with unnecessary detail and inasmuch as such details are within the skill of one of ordinary skill in the art. The present disclosure is not intended to be limited to the described or illustrated implementations, but to be accorded the widest scope consistent with the described principles and features.

A portion of the world's oil reserves exists in carbonate rocks, such as limestone and dolostone. These rocks, however, can vary considerably in characteristics such as texture, porosity, and permeability even across areas within the same formation. This variation makes consistent flow of oil difficult to achieve. Microfluidics is considered a useful method to characterize crude oil interactions with different fluids and with rock formations in petrophysics applications. Conventional calcite ($CaCO_3$) channel models comprise etched natural calcite crystal, but these models are on the scale of micrometers. Fluidics at a nano-scale (that is, on the order of nanometers), are beneficial to understand the physical and chemical phenomena of fluid-fluid and fluid-calcite rock interactions at an atomic scale.

Figure 1:
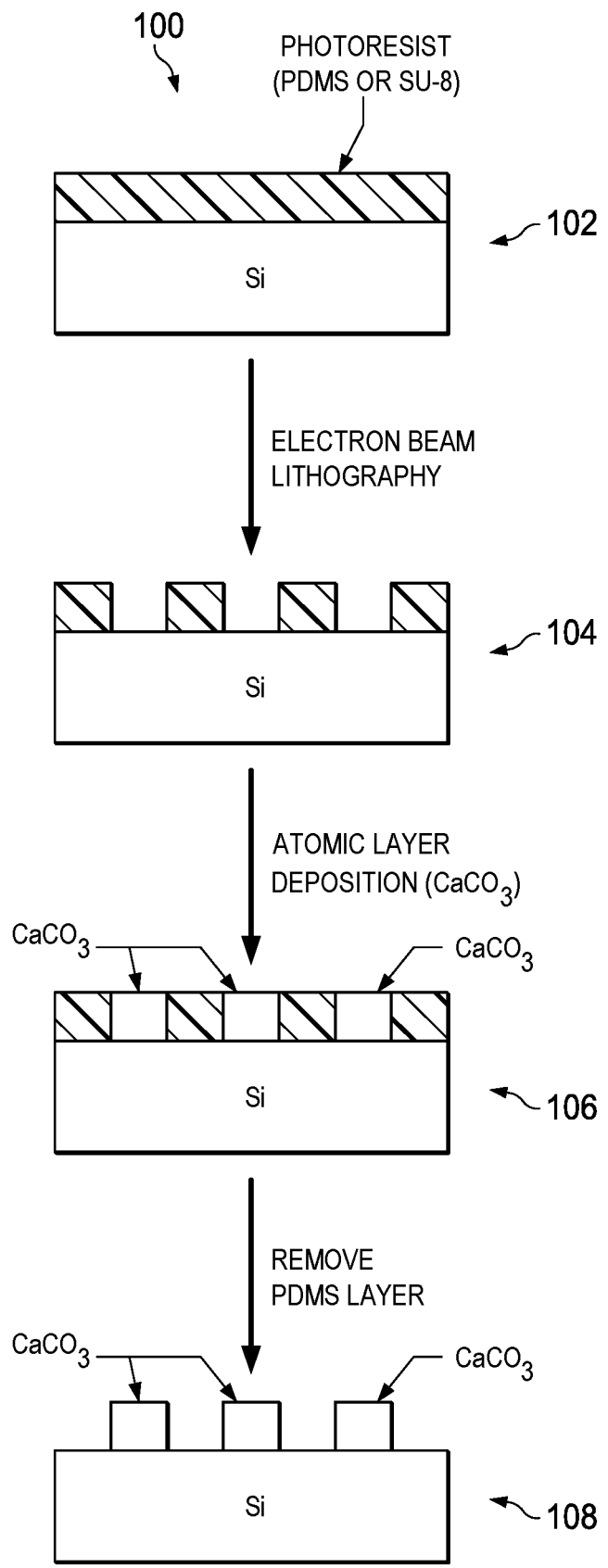
FIG. 1 is a schematic diagram illustrating an example method for fabricating a nanofluidic device, according to an implementation.

Referring to FIG. 1, a method 100 for fabricating calcite channels in a nanofluidic device, starts at 102 by coating a photoresist on a substrate. In certain implementations, the photoresist is a negative photoresist, such as polydimethylsiloxane (PDMS) or SU-8. The substrate can have a clean and flat surface and can be made of, for example, silicon. The coating of the photoresist can be performed by spin coating to apply a layer of photoresist on the substrate at a spin rate in a range of approximately 500 to 2000 revolutions per minute (rpm). The spin rate can determine the thickness of the layer of photoresist. The thickness of the layer of photoresist can determine a height of resulting calcite channels in the nanofluidic device. Therefore, the thickness of the photoresist coating can be chosen based on the desired height for the calcite channels in the nanofluidic device, for example, a height less than 10 centimeters (cm). The preparation of photoresist can include edge bead removal (EBR) to remove any buildup of photoresist on the edge of the substrate. The preparation of photoresist can include a baking step which involves baking at approximately 200 degrees Fahrenheit (° F.) for a duration of time, dependent on the thickness of the layer of photoresist. The baking temperature can also affect the duration of the baking step.

From 102, method 100 proceeds to 104, where a portion of the photoresist is exposed to a beam of electrons. Exposing a portion of the photoresist to a beam of electrons can cause the portion of the photoresist to be removed. In certain implementations, electron beam lithography, is used to remove the photoresist. Electron beam lithography is a technique for patterning at nanometer (nm) scale and includes scanning a beam of electrons on a resist, for example, PDMS. The lithographic process includes exposure of the resist and development of the exposed resist to form a pattern in the remaining resist. Exposure of the resist to an energy source, such as a beam of electrons, modifies the resist physically, chemically, or both. In certain implementations, the beam of electrons is supplied by a scanning electron microscope (SEM). The exposure of the resist can be followed by a post-exposure baking step which involves baking at approximately 200° F. for a duration of time, dependent on the thickness of the layer of photoresist.

The portion of the photoresist that is exposed to the beam of electrons can be exposed in a channel pattern. In general, a portion of the photoresist is exposed to an energy source and developed to form the channel pattern. Sizes of the channel pattern can be chosen based on the desired size for the calcite channels in the nanofluidic device. For positive resists, the development of the resist removes the exposed portion of the resist. For negative resists, the development of the resist removes the unexposed portion of the resist. Developing the resist involves dissolving the resist using a solvent and revealing a portion of a surface of the substrate under the photoresist. In certain implementations, the solvent is an organic solvent, such as propylene glycol methyl ether acetate (PGMEA), ethyl lactate, or di-acetone alcohol. The development time depends on the thickness of the layer of photoresist. The portion of photoresist that remains after development forms an inverse pattern of the calcite channels in the finalized nanofluidic device. After development, the device can be rinsed with fresh solvent, followed by a second wash with another solvent, such as isopropyl alcohol. The device can then be dried with a gas, such as nitrogen.

From 104, method 100 proceeds to 106, where calcite is deposited in the channel pattern using a calcite precursor gas. In certain implementations, atomic layer deposition is used to deposit calcite. Atomic layer deposition is a technique for depositing a material from a vapor phase and includes a sequence of alternating introductions of gaseous chemical precursors that react with the substrate. The individual gas-surface reactions are called half-reactions. During each half-reaction, a precursor gas is introduced for a designated amount of time, to allow the precursor gas to fully react with the substrate surface and deposit a single layer at the surface. The device is then purged with an inert gas, such as nitrogen or argon, to remove unreacted precursor, reaction by-products, or both. The next precursor gas is then introduced to deposit another layer and similarly purged. The process cycles as alternating precursor gas is deposited layer by layer until the desired height is reached. In certain implementations, the atomic layer deposition process can continue until the calcite layers reach a similar or same height as the original coating of photoresist. The deposited calcite can have at least one side with a length in a range of approximately 50 to 100 nm. From 106, method 100 proceeds to 108, where the photoresist remaining after developing the exposed portion of the photoresist in 104 is removed. Removal of the remaining photoresist involves dissolving the photoresist using a solvent, such as the solvent used in developing the resist in 104. The remaining calcite and substrate form the nanofluidic device.

Figure 2A:
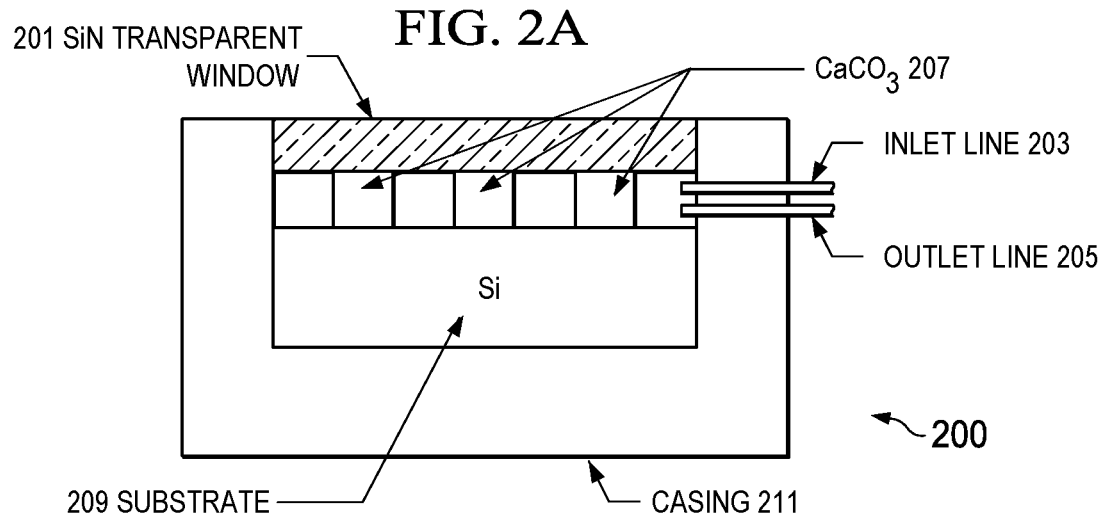
FIG. 2A is a cross-sectional view of a schematic diagram illustrating an example nanofluidic device, according to an implementation.
Figure 2B:
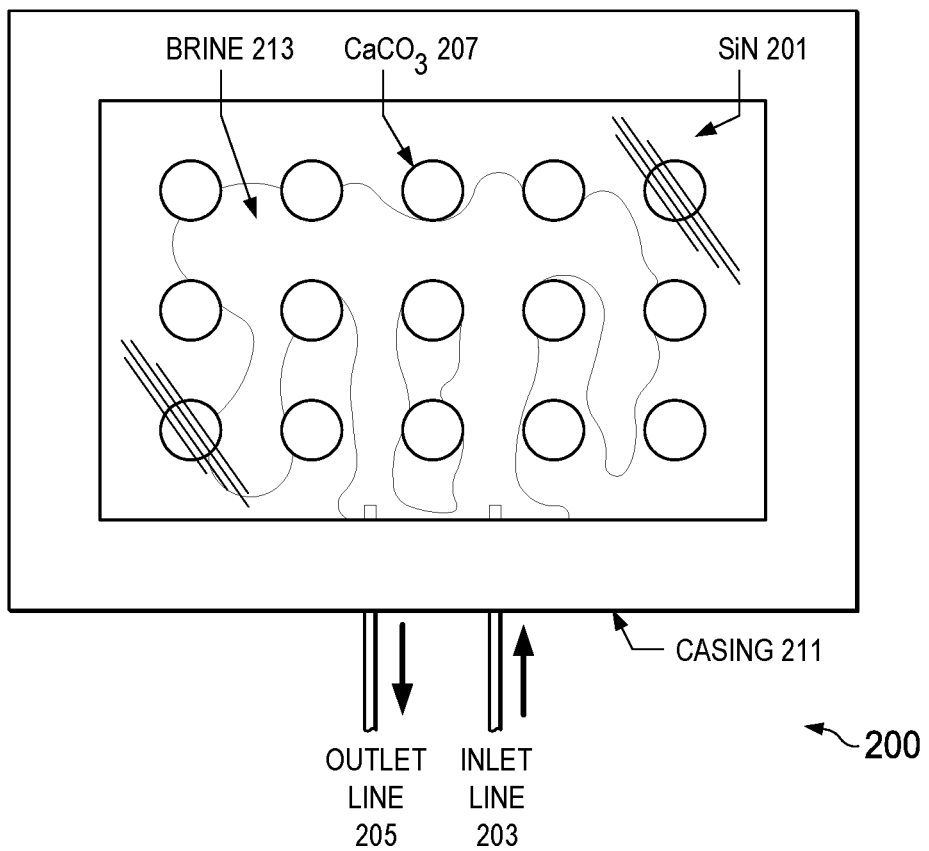
FIG. 2B is a top view of a schematic diagram illustrating an example nanofluidic device, according to an implementation.

FIGS. 2A and 2B illustrate a cross-sectional view and a top view, respectively, of an example nanofluidic device 200. The device 200 includes a silicon substrate 209 and calcite channels 207. The calcite deposits that make up the channels 207 can have any shape, such as acylinder or a cuboid. In addition to varying calcite deposit shapes, the pattern of the calcite channels 207 can be varied. For example, the channels 207 can have a stacked row pattern, where the center of each calcite deposit is in line with a center of a calcite deposit in a row directly above or a row directly below, as illustrated in FIG. 2B. In some implementations, the channels 207 can have a shifted row pattern, where the center of each calcite deposit is not in line with a center of any calcite deposit in a row directly above or a row directly below. The straight or curved edges of the calcite deposits and the channel pattern can represent a variety of geometries that occur in natural calcite reservoirs. In some implementations, the calcite channels 207 of the nanofluidic device 200 can have a length in a range of 50 to 100 nm in at least one dimension. For example, the width of each calcite channel 207 can be in the range of 50 to 100 nm.

Figure 3:
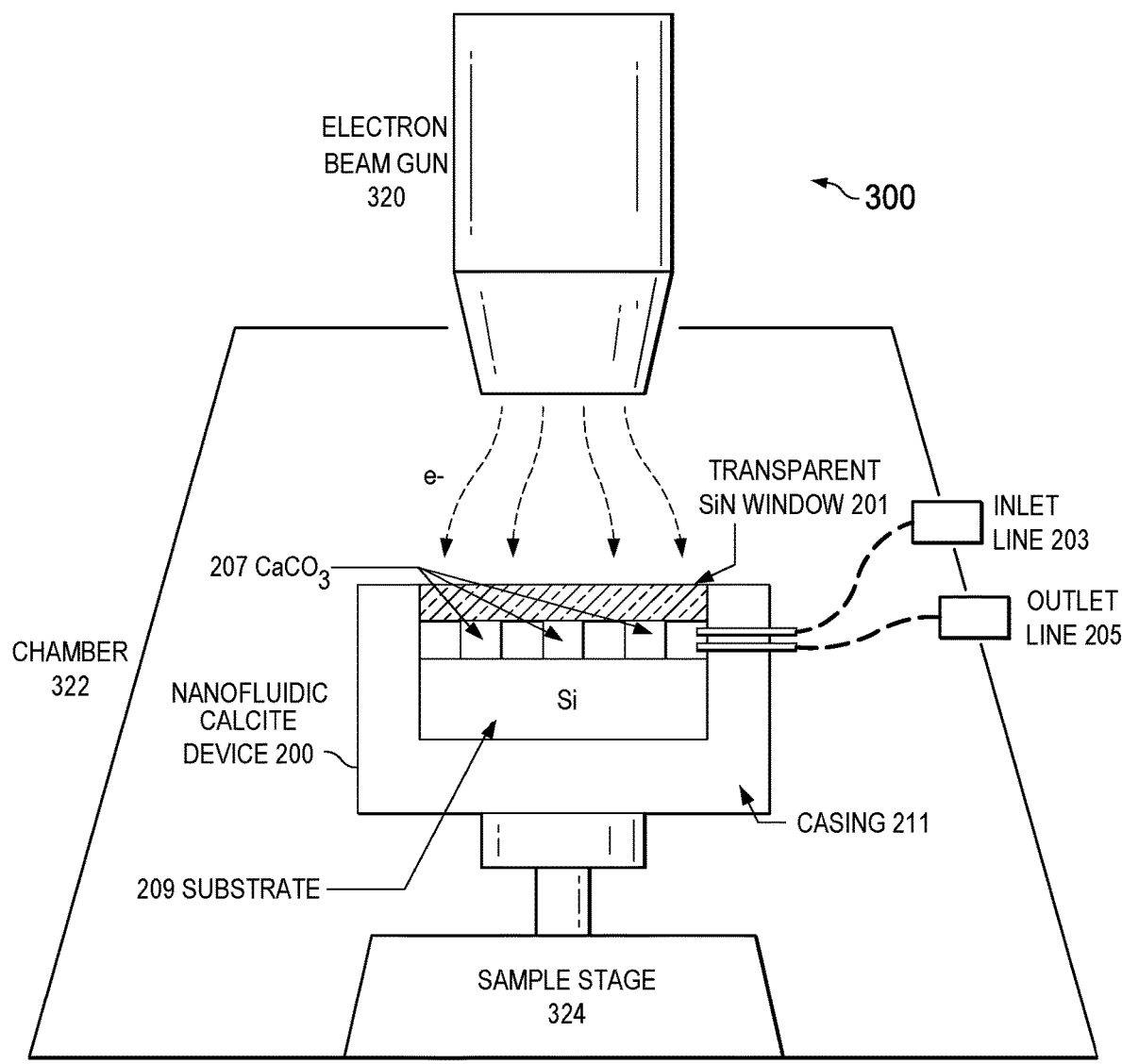
FIG. 3 is a schematic diagram illustrating an example nanofluidic device system, according to an implementation.

Still referring to FIGS. 2A and 2B, the silicon substrate 209 and the calcite channels 207 can be packaged in a casing 211 with a window 201 transparent to an electron beam on top of the calcite channels 207. In certain implementations, the casing 211 can be made of a conductive metal, and the window 201 can be made of an electrically conductive material that is also optically transparent, such as silicon nitride (SiN). Electrical conductivity allows the window 201 to avoid accumulating an electric charge, and the transparency of the window 201 allows observation. As illustrated, the casing has an inlet connection 203 that allows a fluid, such as brine solution 213, to enter the nanofluidic device 200 and an outlet connection 205 that allows fluid to exit. As shown in FIGS. 2A, 2B, and 3, the inlet connection 203 and outlet connection 205 can be located on the same side of device the 200. In some implementations, the inlet connection 203 and outlet connection 205 can be located on opposite or adjacent sides of the device 200.

FIG. 3 illustrates an example system 300 for testing a nanofluidic device 200. For example, the system 300 can image a reaction between the calcite channels 207 and a fluid. The nanofluidic device 200 is positioned on a sample stage 324 located inside a chamber 322. The chamber 322 can isolate the device 200 from outside interference and can be evacuated—that is, a vacuum can be produced within the chamber. Fluid, such as brine solution, can be introduced to the device by inlet line 203, and the fluid can exit by outlet line 205. As fluid flows into and out of the device 200, an electron beam gun 320 emits an electron beam to produce an image of the calcite channels 207 while interacting with the fluid. The electron beam gun 320, chamber 322, and sample stage 324 can be components of a single apparatus, such as an SEM. In certain implementations, the electron beam gun 320 is the same source of electrons used to perform electron beam lithography in fabricating the nanofluidic device 200, for example, a modified SEM capable of performing electron beam lithography.

Calcite reservoirs are typically heterogeneous. Some areas of the reservoir can contain large voids, whereas other areas can have poor connectivity and low permeability. Acid injection is an enhanced oil recovery method that can increase the connectivity of an area of a reservoir. Acid injection can include a brine solution 213 with acid content, for example 10% hydrochloric acid. Acid injection causes carbonate dissolution, and the dynamics of formation dissolution due to acid flow on a pore-scale and an atomic-scale can determine the net flow behavior. The dynamics can also determine other reservoir characteristics such as likelihood for leakage, oil and gas recovery, and storage capacity. As brine solution 213 flows through the nanofluidic device 200, the SEM can be utilized to observe calcite dissolution and preferential flow of brine at a nanometer scale in the device 200. The observations can then be used to quantify acid dissolution of carbonates and to predict the migration of brine through aquifers, such as calcite formations.

Figure 4:
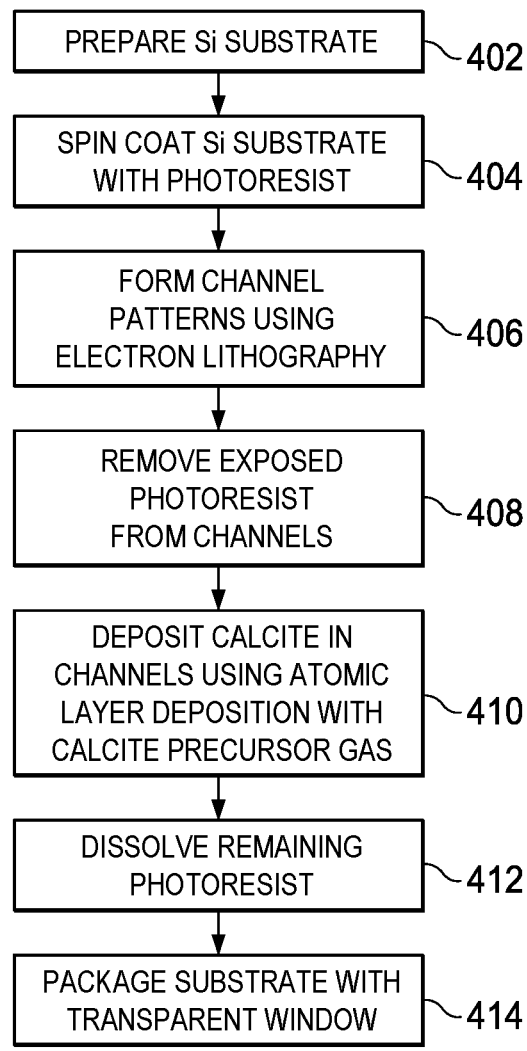
FIG. 4 is a flowchart of an example method for fabricating a nanofluidic device, according to an implementation.

FIG. 4 is a flowchart illustrating an example method 400 for fabricating a calcite channel nanofluidic device. At 402, a silicon substrate is prepared to be the bottom of the nanofluidic device. The size and shape of the substrate can be determined by a sample stage 324 of an SEM. In certain implementations, the nanofluidic device is packaged, and the size of the substrate is smaller than the sample stage 324. Substrate preparation can include cleaning of the substrate. At 404, photoresist is coated on the substrate, for example, by spin coating. A number of parameters can determine the thickness of the coated layer of photoresist such as a spin rate, photoresist viscosity, temperature, and other parameters. In some implementations, the thickness can equal a desired height of calcite channels in a nanofluidic device. In certain implementations, the photoresist is a negative photoresist, such as PDMS or SU-8. At 406, channel patterns are formed using electron beam lithography. Forming channel patterns involves exposing a portion of the photoresist to a beam of electrons, for example, from an SEM. At 408, the exposed portion of the photoresist is developed, that is, removed. Developing the photoresist involves dissolving the photoresist using a solvent, such as PGMEA, ethyl lactate, or di-acetone alcohol. Developing the photoresists also involves revealing a portion of surface of the substrate. At 410, calcite is deposited in the channel patterns using atomic layer deposition with calcite precursor gas. Atomic layer deposition involves depositing calcite, layer by layer. In certain implementations, calcite is deposited layer by layer until the calcite channel height is similar to or the same as the original height of the coated photoresist at 404. At 412, the remaining portion of photoresist is dissolved using a solvent. The calcite channel structure deposited on the substrate and the substrate remain. The formed calcite channels can have a length in a range of 50 to 100 nm in at least one dimension. At 414, the device, which includes the substrate and calcite channels, is packaged in a casing. The casing can include a top portion with a window, a bottom portion that can hold the device, an inlet connection to allow a fluid to enter the device, and an outlet connection to allow the fluid to exit the device. The window can be made of an electrically conductive and optically transparent material, such as SiN, and can be set on top of the calcite channels deposited on the substrate. In certain implementations, the package includes a metal casing around the substrate.

While this specification contains many specific implementation details, these should not be construed as limitations on the scope of any invention or on the scope of what may be claimed, but rather as descriptions of features that may be specific to particular implementations of particular inventions. Certain features that are described in this specification in the context of separate implementations can also be implemented, in combination, in a single implementation. Conversely, various features that are described in the context of a single implementation can also be implemented in multiple implementations, separately, or in any suitable sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional), to achieve desirable results.

Moreover, the separation or integration of various system modules and components in the previously described implementations should not be understood as requiring such separation or integration in all implementations, and it should be understood that the described program components and systems can generally be integrated together in a single software product or packaged into multiple software products.

Accordingly, the previously described example implementations do not define or constrain this disclosure. Other changes, substitutions, and alterations are also possible without departing from the spirit and scope of this disclosure.

What is claimed is:

1. A method of fabricating calcite channels in a nanofluidic device, the method comprising:
   coating a photoresist on a substrate;
   exposing a portion of the photoresist to a beam of electrons, wherein the portion is exposed in a channel pattern;
   developing the exposed portion of the photoresist to form the channel pattern;
   depositing calcite in the channel pattern using a calcite precursor gas, wherein the deposited calcite has a width in a range of approximately 50 to 100 nanometers;
   removing the photoresist remaining after developing the exposed portion of the photoresist; and
   packaging the device in a casing, the casing comprising:
      an inlet connection configured to allow a fluid to enter the device; and an outlet connection configured to allow the fluid to exit the device.

2. The method of claim 1, wherein the substrate comprises silicon.

3. The method of claim 1, wherein the photoresist comprises a negative photoresist.

4. The method of claim 3, wherein the negative photoresist comprises polydimethylsiloxane (PDMS) or SU-8.

5. The method of claim 1, wherein developing the photoresist comprises dissolving the photoresist using a solvent and revealing a portion of the substrate.

6. The method of claim 5, wherein the solvent comprises propylene glycol methyl ether acetate (PGMEA), ethyl lactate, or di-acetone alcohol.

7. The method of claim 1, wherein the casing further comprises:
    a top portion comprising a window; and
    a bottom portion configured to hold the device.

8. The method of claim 7, wherein the window comprises an electrically conductive and optically transparent material.

9. The method of claim 8, wherein the conductive and transparent material comprises silicon nitride (SiN).

10. A system comprising:
    a scanning electron microscope (SEM) system for providing an electron beam;
    a nanofluidic device, wherein the device comprises a bottom portion comprising a substrate and a top portion comprising a calcite channel structure, the calcite channel structure comprising at least one side having a length in a range of approximately 50 to 100 nanometers; and
    a casing for the device, the casing comprising:
        an inlet connection operable to be coupled to the SEM system in order to allow a fluid to enter the device from the SEM system;
        an outlet connection operable to be coupled to the SEM system in order to allow the fluid to exit the device to the SEM system; and
        a top portion comprising a window.

11. The system of claim 10, wherein the substrate comprises silicon.

12. The system of claim 10, wherein the casing further comprises:
    a bottom portion configured to hold the device.

13. The system of claim 12, wherein the window comprises an electrically conductive and optically transparent material.

14. The system of claim 13, where in the conductive and transparent material comprises silicon nitride (SiN).

* * * * *